United States Patent
Seo et al.

(10) Patent No.: US 7,820,244 B2
(45) Date of Patent: Oct. 26, 2010

(54) METHOD OF FORMING A LAYER AND METHOD OF REMOVING REACTION BY-PRODUCTS

(75) Inventors: Jung-Hun Seo, Suwon-si (KR); Jin-Gi Hong, Suwon-si (KR); Yun-Ho Choi, Yongin-si (KR); Hyun-Chul Kwun, Hwaseong-si (KR); Eun-Taeck Lee, Suwon-si (KR); Jin-Ho Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 610 days.

(21) Appl. No.: 11/589,716

(22) Filed: Oct. 31, 2006

(65) Prior Publication Data
US 2007/0202694 A1  Aug. 30, 2007

(30) Foreign Application Priority Data
Oct. 31, 2005  (KR) ............... 10-2005-0102949

(51) Int. Cl.
*C23C 16/00* (2006.01)
(52) U.S. Cl. ............. 427/248.1; 427/585; 117/102; 117/105; 117/106; 117/103; 438/680; 438/681; 438/685
(58) Field of Classification Search ............. 427/248.1, 427/585; 117/102, 105, 106, 103; 438/680, 438/681, 685
See application file for complete search history.

(56) References Cited

U.S. PATENT DOCUMENTS

| 6,511,923 | B1* | 1/2003 | Wang et al. ............. 438/783 |
| 6,551,399 | B1* | 4/2003 | Sneh et al. ............. 117/102 |
| 6,753,271 | B2* | 6/2004 | Sarigiannis et al. ....... 438/785 |
| 6,905,541 | B2* | 6/2005 | Chen et al. ............. 117/86 |
| 2001/0054381 | A1* | 12/2001 | Umotoy et al. .......... 118/715 |

FOREIGN PATENT DOCUMENTS

| JP | 2001-247968 | 9/2001 |
| JP | 2004-232080 | 8/2004 |
| JP | 2005-068559 | 3/2005 |
| KR | 10-0277281 | 10/2000 |
| KR | 1020050093357 | 9/2005 |
| KR | 1020050095433 | 9/2005 |

OTHER PUBLICATIONS

Lim B.S. et al. Nature Materials, vol. 2, Nov. 2003, pp. 749-754.*
Yan Guu et al. Wear, vol. 194, (1996), pp. 12-21.*

* cited by examiner

*Primary Examiner*—Lan Vinh
*Assistant Examiner*—Maki A Angadi
(74) *Attorney, Agent, or Firm*—Harness, Dickey & Pierce, P.L.C.

(57) ABSTRACT

In a method of forming a layer, a titanium layer and a titanium nitride layer may be successively formed on a first wafer. By-products adhered to the inside of a chamber during the formation of the titanium nitride layer may be removed from the chamber. Processes of forming the titanium layer, forming the titanium nitride layer, and removing the by-products may be repeated relative to a second wafer.

20 Claims, 13 Drawing Sheets

METHOD OF FORMING A LAYER AND METHOD OF REMOVING REACTION BY-PRODUCTS

PRIORITY STATEMENT

This application claims priority to Korean Patent Application No. 10-2005-0102949, filed on Oct. 31, 2005, the entire contents of which is incorporated herein by reference.

BACKGROUND OF THE INVENTION

1. Field of the Invention

Example embodiments of the present invention relate to a method of forming a layer and a method of removing reaction by-products. More particularly, example embodiments of the present invention relate to a method of forming a layer and a method of removing reaction by-products to reduce and/or prevent a lifting phenomenon from occurring, which may be caused by the reaction by-products.

2. Description of the Related Art

Recently, semiconductor devices have become smaller and increasingly highly integrated. Accordingly, design rules of the semiconductor devices have become relatively strict. Thus, a diffusion of metal in a metal layer may have a great influence on the semiconductor devices. A metal/metal nitride layer such as a titanium/titanium nitride layer, for example, may be used as a barrier layer to reduce and/or prevent the diffusion of the metals.

In conventional arts, a process for forming a titanium layer and a process for forming a titanium nitride layer are performed in different chambers. That is, the titanium layer may be formed by a plasma enhanced chemical vapor deposition process in a first chamber and the titanium nitride layer may be formed by a thermal chemical vapor deposition process in a second chamber.

FIG. 1 is a plan view illustrating a conventional apparatus for forming a layer.

Referring FIG. 1, a process for depositing a titanium/titanium nitride layer may be successively performed in a pair of chambers. That is, a first chamber 10 may be used for forming a titanium layer and a second chamber 20 may be used for forming a titanium nitride layer. The first chamber 10 and the second chamber 20 may be equipped as a pair. The second chamber 20 may be on standby during wet or dry cleaning of the first chamber 10. Likewise, the first chamber 10 may be on standby during wet or dry cleaning of the second chamber 20. Therefore, operation rates of the first and second chambers 10 and 20 are linked and may be relatively slow.

Moreover, after the process for forming the titanium layer on a wafer is finished in the first chamber 10, the wafer may be transferred to the second chamber 20. Therefore, the wafer and/or the first and second chambers 10 and 20 may be exposed to contaminants. For example, the wafer may be exposed to contaminants during a transfer of the wafer from the first chamber 10 to the second chamber 20. Furthermore, the process for manufacturing the semiconductor devices may be further delayed due to the transfer of the wafer.

SUMMARY

An example embodiments of the present invention provide a method of forming a layer that is capable of reducing and/or preventing a lifting of by-products during the formation of a metal layer and a metal nitride layer in-situ in one chamber.

An example embodiment of the present invention provides a method of forming a layer. In this method, a first wafer may be loaded into an airtight chamber. A first layer having a first adhesion strength may be formed on the first wafer by supplying a first gas into the chamber. A second layer having a second adhesion strength weaker than the first adhesion strength may be formed on the first layer by supplying a second gas into the chamber. The first wafer having the first layer and the second layer may be unloaded from the chamber. By-products, which are generated by forming the second layer, which may be adhered to an inner wall of the chamber may be removed by supplying a third gas to the chamber. A cycle, which may include loading a second wafer, forming the first layer on the second wafer, forming the second layer on the first layer, unloading the second wafer, and removing by-products, which may be generated by forming the second layer on the second wafer, under conditions substantially the same as those under which the above-mentioned processes are performed on the first wafer may be carried out.

According to an example embodiment of the present invention, the first layer may include a metal layer such as a titanium layer, for example, and the second layer may include a metal nitride layer such as a titanium nitride layer, for example.

According to an example embodiment of the present invention, forming the first layer, forming the second layer, unloading the first wafer, and removing the by-products may be performed at a temperature within a range of about 400° C. to about 700° C.

According to an example embodiment of the present invention, in the method of forming a layer, after the first layer and the second layer are formed on the first wafer, the by-products adhered to the chamber during the formation of the second layer may be removed. Therefore, when the cycle for forming a layer on the second wafer is performed, a lifting of the by-products may be reduced and/or prevented. Further, the first layer and the second layer may be formed in one chamber by an in-situ process so that the formation of one or more layers may take less time.

According to another example embodiment of the present invention, a first protection layer for protecting an airtight chamber may be formed on an inner wall of an airtight chamber by supplying a first protective gas into the chamber. A second protection layer for protecting the first protection layer may be formed on the first protection layer by supplying a second protective gas into the chamber. A first wafer may be loaded into the chamber. A first layer having a first adhesion strength may be formed on the first wafer by supplying a first gas into the chamber. A second layer having a second adhesion strength weaker than the first adhesion strength may be formed on the first layer by supplying a second gas into the chamber. The first wafer having the first layer and the second layer may be unloaded from the chamber. By-products, which may be generated by forming the second layer and may be adhered to the chamber, may be removed by supplying a third gas to the chamber. A cycle, which may include loading a second wafer, forming the first layer on the second wafer, forming the second layer on the first layer, unloading the second wafer, and removing by-products that may be generated by the formation of the second layer on the second wafer, under conditions substantially the same as those under which the above-mentioned processes are performed on the first wafer may be carried out.

According to an example embodiment of the present invention, the first protective gas may include fluorine and the second protection layer may include a titanium layer. Further, the first layer may include a metal layer such as a titanium layer, for example, and the second layer may include a metal nitride layer such as a titanium nitride layer, for example.

According to an example embodiment of the present invention, in a method of forming a layer, the first protective layer may reduce and/or prevent damage to the chamber. After the process on the first wafer is performed, the by-products adhered to the chamber may be removed. Therefore, when a process for forming a layer on the second wafer is performed, a lifting of the by-products may be reduced and/or prevented. Additionally, the first layer and the second layer may be formed in one chamber by an in-situ process so that the formation of one or more layers may take less time.

An example embodiment of the present invention provides a method of removing reaction by-products. In this method, first by-products having a first adhesion strength, which may be generated by the formation of a first layer on a wafer using a first gas, may be adhered to an inner wall of a chamber. Second by-products having a second adhesion strength weaker than the first adhesion strength, which may be generated by formation of a second layer on the wafer using a second gas, may be adhered to the inner wall of the chamber. The second by-products may then be selectively removed using a third gas.

According to an example embodiment of the present invention, the first by-products may include a metal such as titanium, for example, and the second by-products may include a metal nitride such as titanium nitride, for example.

According to an example embodiment of the present invention, the adhering the first by-products and the second by-products and the removal of the second by-products may be carried out at a temperature within a range of about 400° C. to about 700° C.

An example embodiment of the present invention provides a method of forming a layer. This method may include loading a wafer into a chamber; forming a first layer on the wafer by supplying a first gas into the chamber; forming a second layer on the first layer by supplying a second gas into the chamber; unloading the wafer having the first layer and the second layer from the chamber; and removing by-products, which are generated by forming the second layer, adhered to an inner wall of the chamber by supplying a third gas to the chamber.

BRIEF DESCRIPTION OF THE DRAWINGS

Example embodiments of the present invention will become readily apparent by reference to the following detailed description when considered in conjunction with the accompanying drawings.

FIG. 2 is a cross-sectional view illustrating an apparatus for forming a layer in accordance with an example embodiment of the present invention.

FIG. 3 is a flow chart illustrating a method of forming a layer in accordance with an example embodiment of the present invention.

FIGS. 4 to 9 are cross-sectional views illustrating a stage and a showerhead that may be used in the method shown in FIG. 3.

FIG. 10 is a flow chart illustrating a method of forming a layer in accordance with another example embodiment of the present invention.

FIGS. 11 to 18 are cross-sectional views illustrating a stage and a showerhead that may be used in the method shown in FIG. 10.

FIG. 19 is a flow chart illustrating a method of removing by-products in accordance with an example embodiment of the present invention.

FIGS. 20 to 22 are cross-sectional views illustrating a showerhead that may be used in the method shown in FIG. 19.

DESCRIPTION OF EXAMPLE EMBODIMENTS

Figure 1:
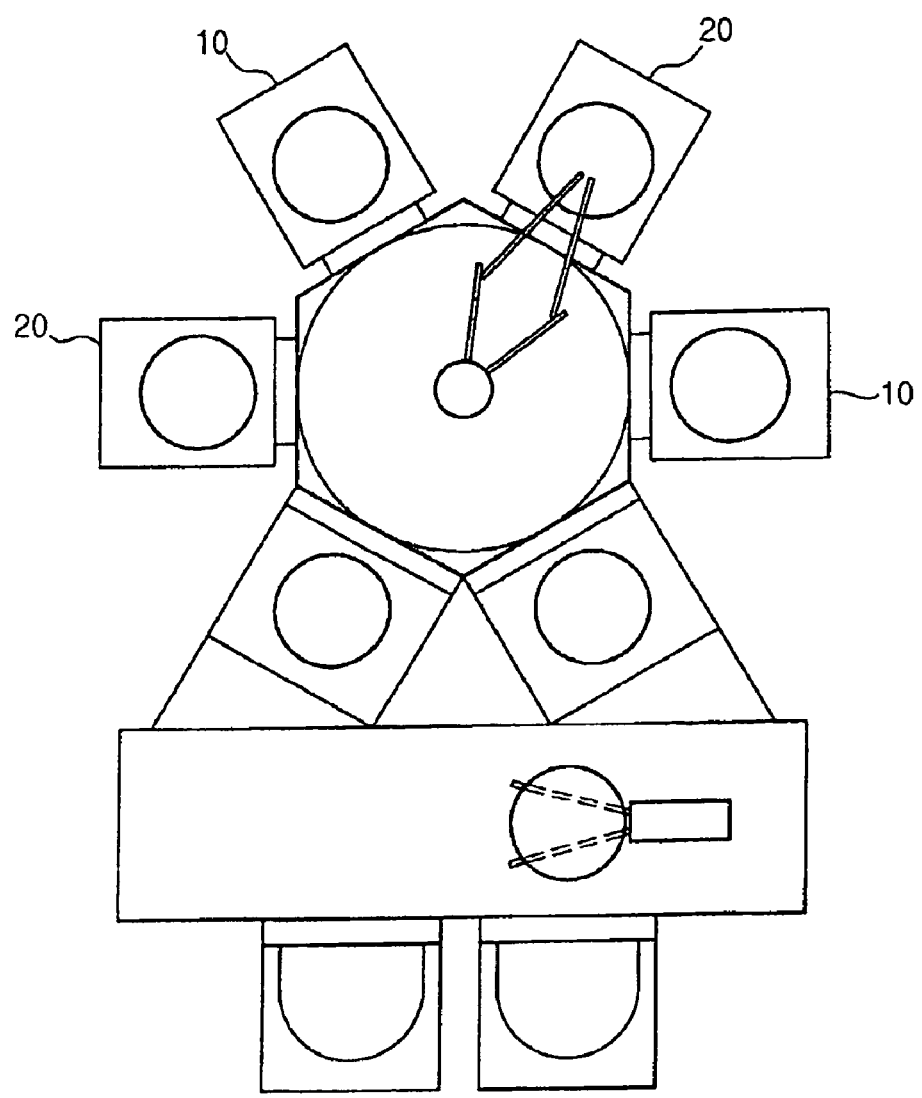
FIG. 1 is a plan view illustrating a conventional apparatus for forming a layer.

Various example embodiments of the present invention will be now described more fully with reference to the accompanying drawings in which some example embodiments of the present invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed, but on the contrary, example embodiments of the present invention are to cover all modifications, equivalents, and alternatives falling within the scope of the invention. Like numbers refer to like elements throughout the description of the figures.

The terminology used herein is for the purpose of describing particular embodiments only and is not intended to be limiting of example embodiments of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath," "below," "lower," "above," "upper" and the like, may be used herein for ease of description to describe one element or a feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the present invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention providing a method of forming a layer and a method of removing reaction by-products will now be described more fully with reference to the accompanying drawings in which example embodiments of the present invention are shown.

Figure 2:
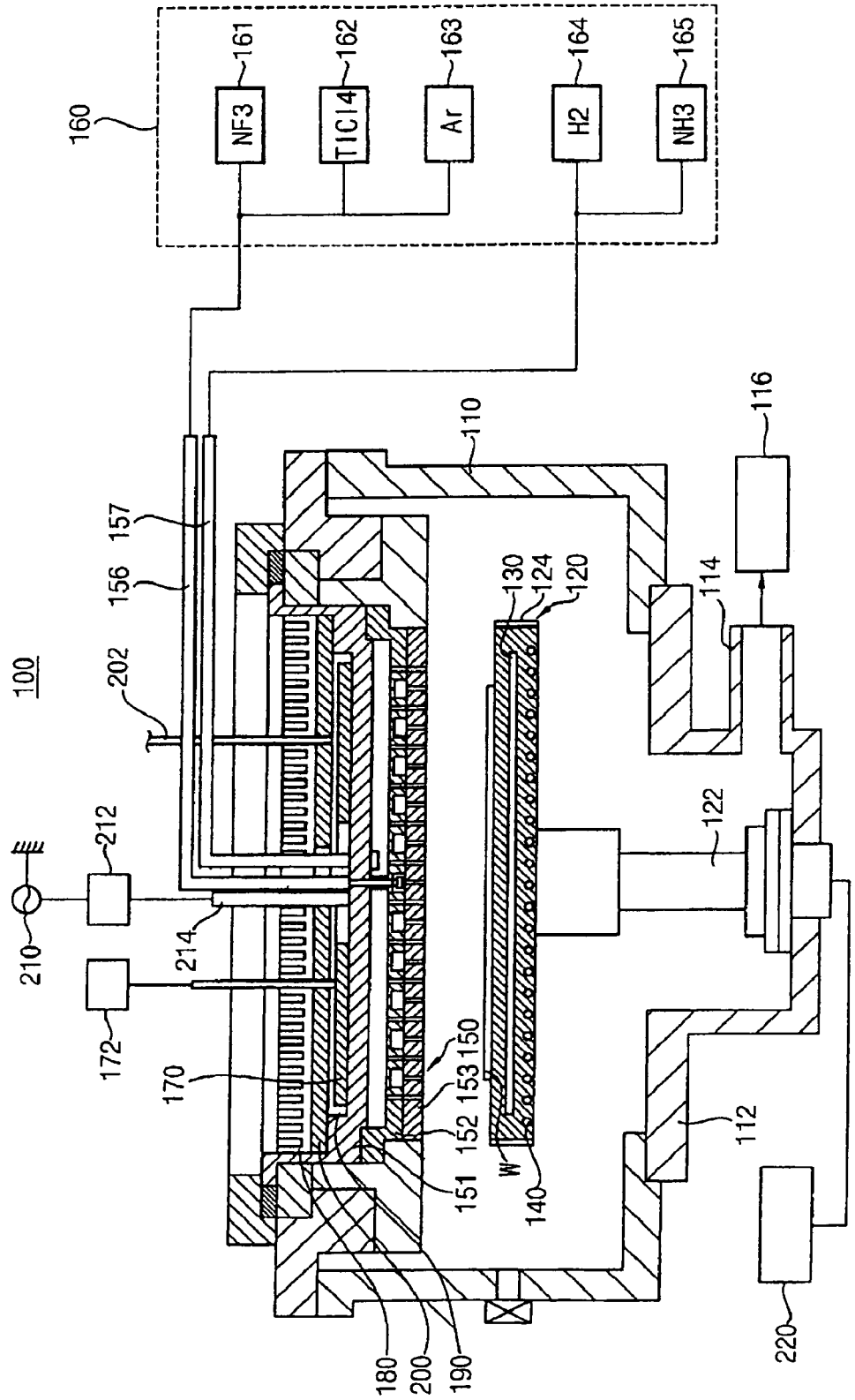
FIGS. 2-22 represent non-limiting example embodiments of the present invention as described herein.

FIG. 2 is a cross-sectional view illustrating an apparatus for forming a layer in accordance with an example embodiment of the present invention.

Referring to FIG. 2, the apparatus 100 for forming a layer may include a cylindrical or cubic chamber 110. A stage 120 may be located in the chamber 110. The stage 120 may support a semiconductor wafer W. The wafer W may be arranged horizontally on the stage 120 as shown in FIG. 2. A stage support member 112 may be mounted to a central portion of a bottom face of the chamber 110. The stage support member 112 may protrude downward from the bottom face of the chamber 10. A seal (not shown) may be interposed between the bottom surface of the chamber 110 and the stage support member 112. A cylindrical shaft 122 may have a lower end extending outside of the chamber through the stage support member 112 and an upper end fixed to a bottom surface of the stage 120.

A ring 124 for focusing plasma on the stage 120 may be located along an edge of the stage 120. A stage heater 130 for heating the stage 120 may be built-in the stage 120. Power may be supplied from a power supply (not shown) to the stage heater 130 so that the wafer W on the stage 120 may be heated to a desired and/or predetermined temperature.

The stage heater 130 may maintain a temperature of the stage 120 substantially constant during the formation of a titanium layer on the wafer W, the formation of the titanium nitride layer on the wafer W, and the removal of the titanium nitride layer from the chamber 110. For example, the temperature may be kept at a temperature within a range of about 400° C. to about 700° C.

A cooling line 140 for cooling the wafer W and/or the stage 120 may be located in the stage 120. A coolant may circulate through a cooling line 140 to cool the wafer W and/or the stage 120 to a desired temperature.

Alternatively, a cooling gas may be directly supplied onto a backside of the wafer to cool the wafer W. The cooling gas may be an inert gas.

A showerhead 150 may be located at an upper portion of the chamber 110, and the showerhead 150 may face the stage 120. The showerhead 150 may have a circular shape when viewed in a plan view, for example. The material used for the showerhead 150 may include nickel, aluminum, etc. The showerhead 150 may have an upper plate 151, a middle plate 152, and a lower plate 153.

A first gas introducing line 156 and a second gas introducing line 157 may be connected to the showerhead 150. The showerhead 150 may correspond to a matrix type showerhead. For example, in the matrix type showerhead, a first gas flowing through the first gas introducing line 156 and a second gas flowing through the second gas introducing line 157 may be independently introduced into the chamber 110. That is, the first gas flowing through the first gas introducing line 156 and the second gas flowing through the second gas introducing line 157 may not be mixed with each other in the showerhead 150.

According to an example embodiment, a gas supply unit 160 may include a first gas source 161 for supplying a cleaning gas such as $NF_3$ gas, a second gas source 162 for supplying a process gas such as $TiCl_4$ gas, a third gas source 163 for supplying a carrier gas such as Ar gas, a fourth gas source 164 for supplying a reduction gas such as a $H_2$ gas, and a fifth gas source 165 for supplying a nitrifying gas such as an $NH_3$ gas used for nitrifying a Ti layer.

While the example embodiment described in the previous paragraph indicates that a $NF_3$ gas may be used for the cleaning gas, examples of the cleaning gas include an $NF_3$ gas, an $F_2$ gas, and a $Cl_2$ gas. These may be used alone or in a mixture thereof.

The first, second and third gas sources 161, 162 and 163 may be connected to the first gas introducing line 156. The fourth gas source 164 and the fifth gas source 165 may be connected to the second gas introducing line 157. Accordingly, in a process for forming the titanium layer, the process gas, for example, a TiCl$_4$ gas and the reduction gas, for example, H$_2$ gas may be separately introduced into the chamber 110 and may then be mixed with each other in the chamber 110. In a process for forming the titanium nitride layer, the process gas, for example, TiCl$_4$ gas and the nitrifying gas, for example, NH$_3$ gas may be separately introduced into the chamber 110 and may then be mixed with each other in the chamber 110.

While the previously described example embodiment indicates an Ar gas may be used for the carrier gas, other examples of the carrier gas may include a N$_2$ gas and a He gas. Further, mass flow controllers (not shown) and valves (not shown) may be located between each of gas sources 161, 162, 163, 164 and 165 and the gas introducing lines 156 and 157. Accordingly, a kind of gas provided through the gas introducing lines 156 and 157 may be changed.

A showerhead heater 170 may be located on the upper plate 151 of the showerhead 150. For example, the showerhead heater 170 may include a pair of resistive heating elements having a thin plate shape and an insulation plate including mica interposed between the heating elements. The showerhead heater 170 may be connected to a power source 172.

A space 190 may be located over the showerhead heater 170. An insulation member 200 may be disposed over the space 190. A dry gas for cooling the showerhead 150 may be circulated in the space 190. Alternatively, a linear cooling line (not shown) for cooling the showerhead 150 may be located in the insulation member 200.

A dry gas supply line 202 may be connected to the space 190. The dry gas may serve as a coolant supplied to the space 190 through the insulation member 200. The dry gas may absorb heat radiated from the showerhead heater 170 and may be exhausted from the space 190 through an outlet (not shown).

A heat dissipation plate 180 may be located on the insulation member 200. An example of a material that may be used for the heat dissipation plate 180 is aluminum. The heat dissipation plate 180 may uniformly distribute heat generated from the showerhead 150 to readily dissipate the heat into the air.

While the previously described example embodiment indicates that dry gas may be used for the cooling gas, examples of the cooling gas may include a He gas, an Ar gas, a H$_2$ gas, and a N$_2$ gas. These may be used alone or in a mixture thereof.

A power supply rod 214 may be electrically connected to the upper face of the upper plate 151 of the showerhead 150. A high frequency power source 210 may be electrically connected to the power supply rod 214 through a matcher 212. A radio frequency (RF) power may be supplied from the power source 210 to the showerhead 150 to generate a high frequency electric field in the chamber 110.

The power source 210 may be activated and/or deactivated. In a process of forming the titanium layer on the wafer W, the power source 210 may be activated and may convert the process gas and the reduction gas provided from the gas supply unit 160 into a plasma state. In a process of cleaning the chamber 110, the power source 210 may be activated and may convert the cleaning gas provided from the gas supply unit 160 into a plasma state.

While the previous paragraph indicates that the process gas, the reduction gas, and the cleaning gas may be converted into the plasma states in the chamber 110 by the power source 210, the process gas, the reduction gas and the cleaning gas may be converted into plasma states by a remote plasma method.

In a process of forming the titanium nitride layer, the process gas and the reduction gas provided from the gas supply unit 160 may be thermally decomposed at a high temperature so that the power source 210 may be deactivated.

An exhaust line 114 may be connected to a sidewall of the stage support member 112 mounted to the chamber 110. An exhaust unit 116 may be connected to the exhaust line 114, and the exhaust unit 116 may exhaust remaining gases and/or by-products from the chamber 110 through the exhaust line 114. Further, the exhaust unit 116 may decompress the chamber 110 to create a vacuum in the chamber 110.

A driving unit 220 may be connected to the cylindrical shaft 122 extending outside the chamber 110. The driving unit 220 may move the cylindrical shaft 122 and the stage 120 in a vertical direction so that a distance between the stage 120 and the showerhead 150 may be adjusted. For example, in a process of forming the titanium layer on wafer W, the distance between the stage 120 and the showerhead 150 may be maintained at a relatively small distance. Whereas, in a process of forming the titanium nitride layer on wafer W, the distance between the stage 120 and the showerhead 150 may be maintained at a relatively large distance. Further, a stopper (not shown) for restricting the vertical range of movement of the cylindrical shaft 122 may be provided on the cylindrical shaft 122.

While the above described example embodiment indicates the stage 120 may be moved in a vertical direction to control the distance between the stage 120 and the showerhead 150, a driving unit may be connected to the showerhead 150 to move the showerhead 150 in a vertical direction. The driving unit may move the showerhead 150 in the vertical direction to control the distance between the stage 120 and the showerhead 150. Moreover, two driving units for adjusting the distance between the stage 120 and the showerhead 150 may be connected to the stage 120 and the showerhead 150, respectively.

Figure 3:
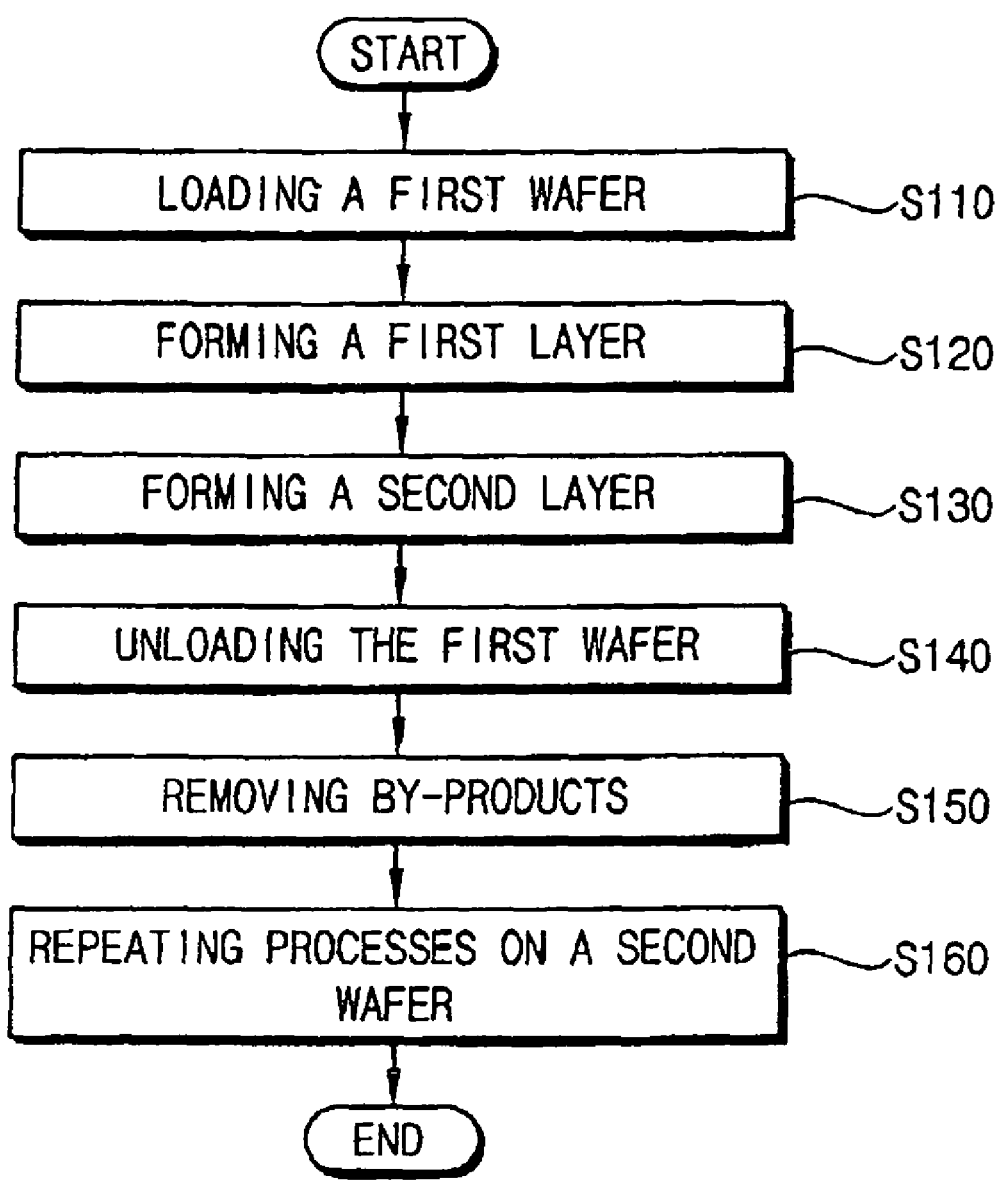

FIG. 3 is a flow chart illustrating a method of forming a layer in accordance with an example embodiment of the present invention, and FIGS. 4 to 9 are cross-sectional views illustrating a stage and a showerhead that may be used in the method shown in FIG. 3. While first by-products and second by-products, which will be mentioned later in this application, are generally formed on an entire inner wall a chamber, for convenience, only the first by-products and the second by-products formed on a stage and a showerhead are illustrated in FIGS. 4 to 9.

Figure 4:
Figure 4:
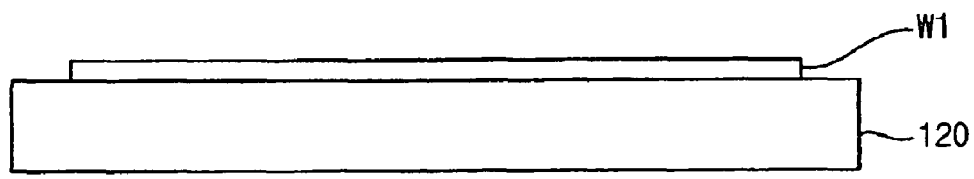

Referring to FIGS. 3 and 4, a first wafer W1 may be loaded on the stage 120 through a gate valve located on one side of the chamber 110 in process S110.

Figure 5:
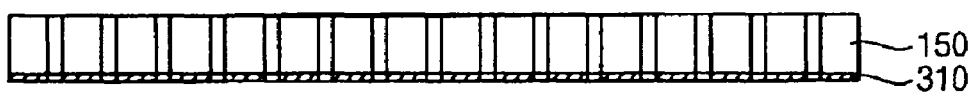
Figure 5:
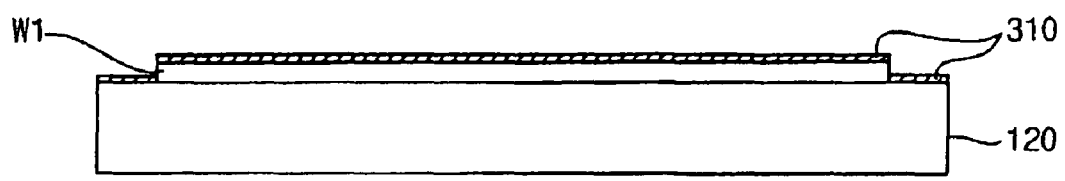

Referring to FIGS. 3 and 5, the stage 120 may be transferred in a vertical direction by the driving unit 220 in order to control a distance between the stage 120 and the showerhead 150. The distance may be controlled to have a first distance. The stage 120 may be heated to a temperature within a range of about 500° C. to about 700° C. by the stage heater 130. The showerhead 150 may be heated by the showerhead heater 170 to a temperature within a range of about 400° C. to about 700° C. for forming a titanium layer 310 having high adhesion strength. A processing gas for depositing the titanium layer 310 that may include a H$_2$ gas, a TiCl$_4$ gas and an Ar gas may be supplied from a gas supply unit 160 to the chamber 110 at a desired and/or predetermined flow rate through the showerhead 150. Here, the titanium layer 310 may be formed by a plasma enhanced chemical vapor deposition process. Therefore, a radio frequency (RF) power may be supplied from the power source 210 to the showerhead 150 to generate a high frequency electric field in the chamber 110. Accordingly, the titanium layer 310 having a first adhesion strength may be formed on the first wafer W1 as shown by process S120 in FIG. 3.

During the formation of the titanium layer 310 on the first wafer W1, first by-products including the titanium layer 310 may be adhered to an inner wall of the chamber 110, a surface of the stage 120, and a surface of the showerhead 150. The first by-products may have the first adhesion strength.

After the titanium layer 310 is formed on the first wafer W1, a power supply to the showerhead 150 and a supply of gases, for example, $H_2$, $TiCl_4$ and Ar gases, to the chamber 110 may be suspended. Then, a $NF_3$ gas, for example, serving as the cleaning gas, may be supplied from the gas supply unit 160 to the chamber 100, and non-reacted gases and by-products generated by forming the titanium layer 310 may be exhausted through the exhaust line 114 by an operation of the exhaust unit 116.

Figure 6:
Figure 6:
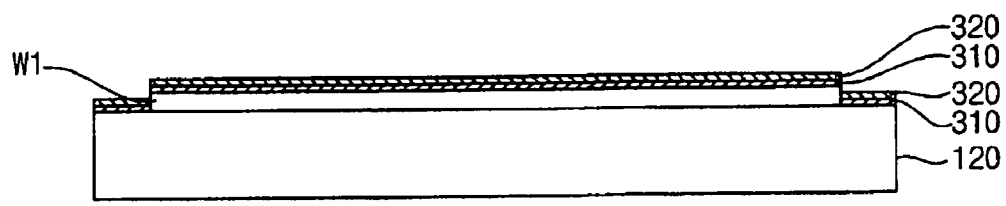

Referring to FIGS. 3 and 6, after the inside the chamber 110 is cleaned, the stage 120 may be descended by the driving unit 220 in order to adjust the distance between the stage 120 and the showerhead 150 to have a second distance. The second distance may be substantially larger that the first distance. The stage heater 130 may heat the stage 120 to provide the stage 120 with a temperature substantially the same as the temperature used for forming the titanium layer 310. That is, the temperature of the stage 120 may be maintained within a range of about 500° C. to about 700° C. Further, the showerhead heater 170 may heat the showerhead 150 to provide the showerhead 150 with a temperature substantially the same as the temperature used for forming the titanium layer 310. That is, the temperature of the showerhead 150 may be maintained within a range of about 400° C. to about 700° C. A processing gas for forming a titanium nitride layer 320 that may include a $NH_3$ gas, a $TiCl_4$ gas and an Ar gas, for example, may be supplied from a gas supply unit 160 to the chamber 110 at a desired and/or predetermined flow rate through the showerhead 150. The titanium nitride layer 320 may be formed by a thermal chemical vapor deposition process. Therefore, the power source 210 may be deactivated so that a RF power is not supplied from the power source 210 to the showerhead 150. Accordingly, the titanium nitride layer 320 having a second adhesion strength may be formed on the titanium layer 310 in process S130. The second adhesion strength may be substantially weaker than the first adhesion strength according to an example embodiment of the present invention.

While the titanium nitride layer 320 is being formed on the titanium nitride layer 310, second by-products including the titanium nitride layer 320 may be adhered to the first by-products. The second by-products may have the second adhesion strength.

After the titanium nitride layer 320 is formed on the titanium nitride layer 310, a supply of gases, for example, $NH_3$ gas, $TiCl_4$ gas, and Ar gas to the chamber 110 may be suspended. Then, a $NF_3$ gas serving as the cleaning gas may be supplied from the gas supply unit 160 to the chamber 100, and non-reacted gases and by-products generated by forming the titanium layer 310 may be exhausted through the exhaust line 114 by an operation of the exhaust unit 116.

Figure 7:
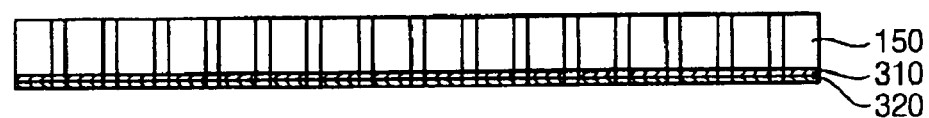
Figure 7:
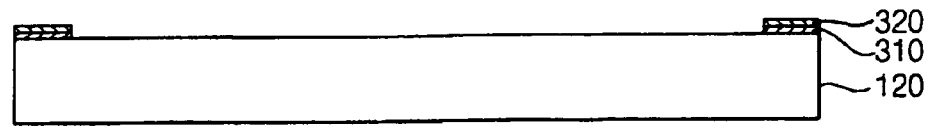

Referring to FIGS. 3 and 7, the first wafer W1 on which the titanium layer 310 and the titanium nitride layer 320 may be formed may be unloaded from the chamber 110 through the gate valve as shown by process S140 in FIG. 3.

When the titanium layer 310 and the titanium nitride layer 320 are formed on a second wafer W2, the second by-products may drop from the inner wall of the chamber 110 because the second adhesion strength of the second by-products is weakened. The dropped second by-products may serve as particles in forming the titanium layer 310 and the titanium nitride layer 320 on the second wafer W2. Therefore, the second by-products should be removed according to an example embodiment of the present invention.

Figure 8:
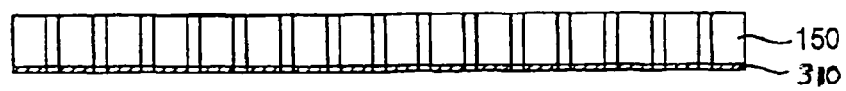
Figure 8:
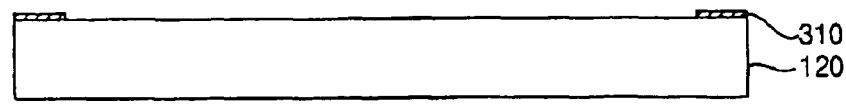

Referring to FIGS. 3 and 8, the first wafer W1, on which the titanium layer 310 and the titanium nitride layer 320 may be formed, may be unloaded from the chamber 110 and the gate valve may be closed. The temperatures of the stage 120 and the showerhead 150 may be kept at a temperature substantially the same as those of the stage 120 and the showerhead 150 during the process of forming the titanium layer 310 and the titanium nitride layer 320.

A cleaning gas for removing the second by-products may be supplied from a gas supply unit 160 to the chamber 110. Examples of cleaning gas include an $NF_3$ gas, an $Fl_2$ gas, a $Cl_2$ gas, etc. These may be used alone or in a mixture thereof.

A RF power may be supplied from the power source 210 to the showerhead 150 to convert the cleaning gas into a plasma state. Alternatively, the cleaning gas may be converted into a plasma state outside of the chamber 110 by a remote plasma method and the cleaning gas may be provided to the chamber 110 in the plasma state.

Alternatively, the cleaning gas may not be converted into the plasma state because the power source 210 may be deactivated. In this case, after the cleaning gas is heated to a high temperature, the heated cleaning gas may be provided to the chamber 110.

The second by-products in the chamber 110 may react with the cleaning gas to remove the second by-products as shown by process S150 in FIG. 3.

In the process for removing the second by-product according to an example embodiment of the present invention, there is no need to change the temperatures of the stage 120 and the showerhead 150. Therefore, the process for removing the second by-products may be substantially immediately performed after the process for forming the titanium layer 310 and/or the titanium nitride layer 320 is completed.

After removing the second by-products, the power supply to the showerhead 150 and the $NF_3$ gas supply may be suspended.

A $NF_3$ gas serving as the cleaning gas may be supplied from the gas supply unit 160 to the chamber 110. The by-products generated by forming the titanium layer 310 may be exhausted through the exhaust line 114 by an operation of the exhaust unit 116.

Figure 9:
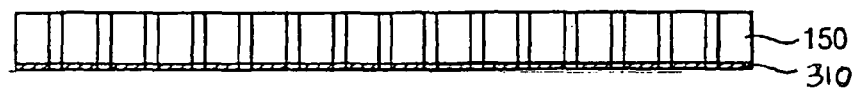
Figure 9:
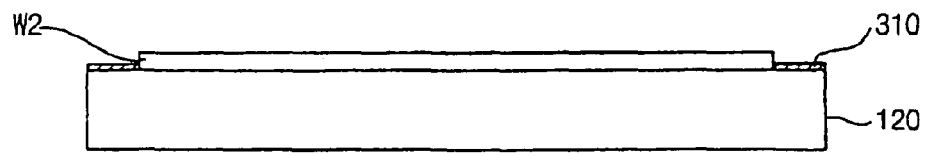

Referring to FIGS. 3 and 9, processes substantially the same as those performed on the first wafer W1 may be performed on the second wafer W2 in process S160 of FIG. 3. That is, the second wafer W2 may be loaded into the chamber 110 and supported by the stage 120. The titanium layer 310 and the titanium nitride layer 320 may be successively formed on the second wafer W2. Then, the second wafer W2 may be unloaded from the chamber 110. The second by-products may then be removed from the chamber 110.

While the above processes are repeated on the second wafer W2, there is no need to change the temperatures of the stage 120 and the showerhead 150. Therefore, the above processes may be substantially immediately performed on the second wafer W2 after the second by-products are removed.

In the above-described method of forming a layer according to an example embodiment of the present invention, the titanium layer and titanium nitride layer may be formed by an in-situ process in one chamber 110. Moreover, the second by-products adhering to the inside the chamber 110 may be removed to reduce and/or prevent unwanted particles from being generated.

Further, the temperatures of the stage 120 and the showerhead 150 may be kept relatively constant. Therefore, the efficiency of the process of forming a layer may be improved because fewer resources are used and/or needed to change the temperatures of the stage 120 and the showerhead 150.

Figure 10:
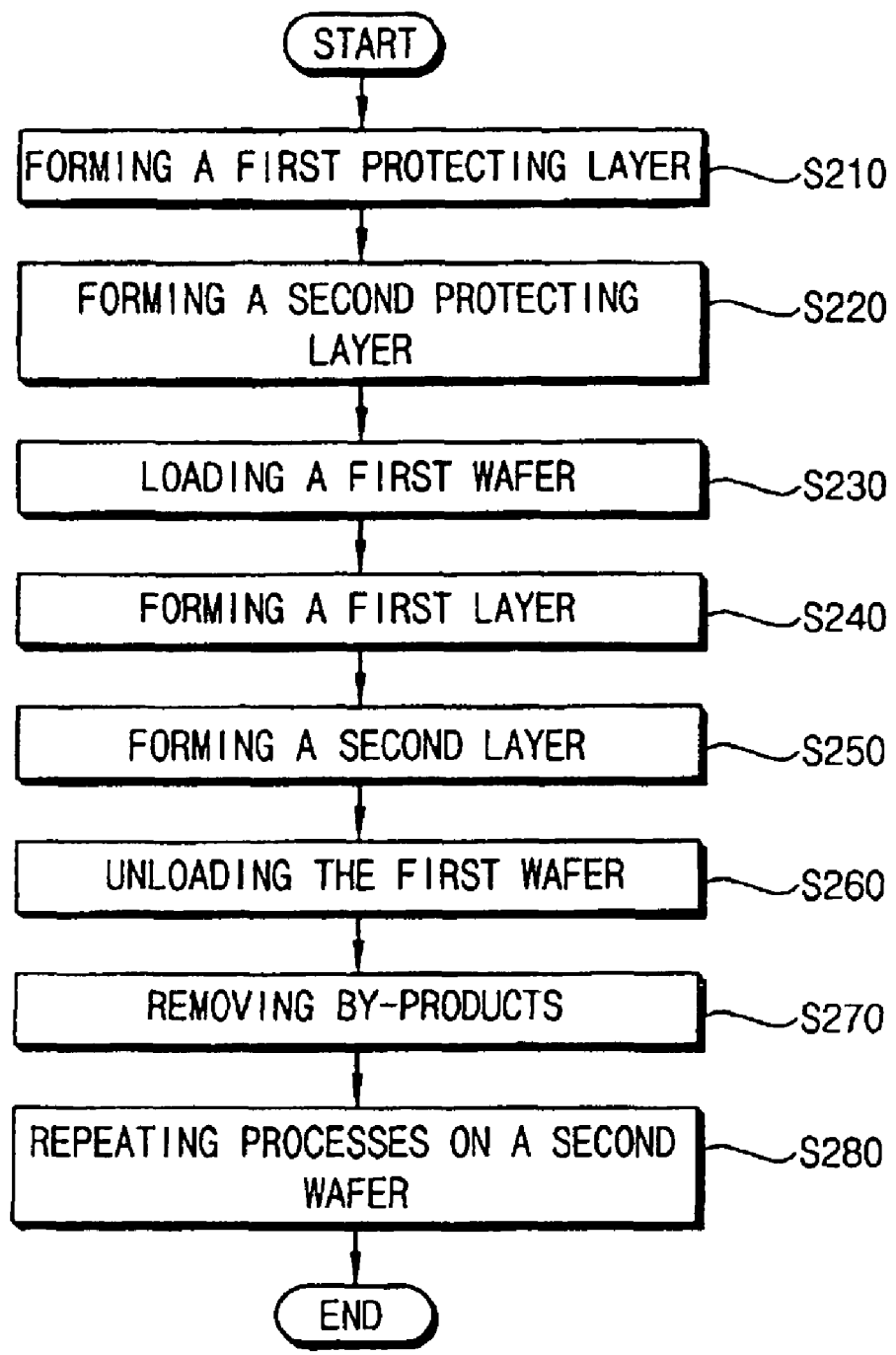

FIG. 10 is a flow chart illustrating a method of forming a layer in accordance with another example embodiment of the present invention, and FIGS. 11 to 18 are cross-sectional views illustrating a stage and a showerhead that may be used in the method shown in the flow chart of FIG. 10. While first by-products and second by-products mentioned later may be formed on an entire inner wall of a chamber, only the first by-products and the second by-products adhered to a stage and a showerhead are illustrated in FIGS. 11 to 18.

Figure 11:
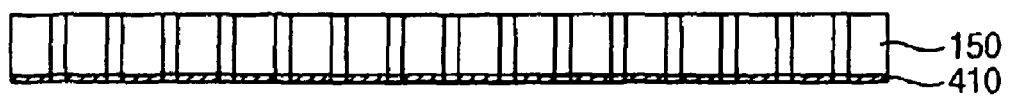
Figure 11:
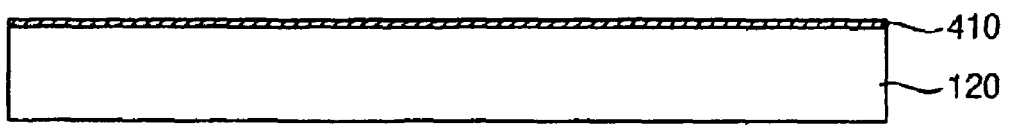

Referring to FIGS. 10 and 11, the stage 120 may be heated to a temperature of about 300° C. by the stage heater 130 for forming an $AlF_3$ layer 410. The showerhead 150 may be heated to a temperature of about 300° C. by the showerhead heater 170 for forming the $AlF_3$ layer 410. A processing gas for forming the $AlF_3$ layer 410, for example, $NF_3$ gas or $F_2$ gas may be supplied from a gas supply unit 160 to the chamber 110 at a desired and/or predetermined flow rate through the showerhead 150. For example, the $NF_3$ gas or the $F_2$ gas may be supplied to the chamber 110 at a temperature of about 300° C. The $NF_3$ gas or the $F_2$ gas may react with an aluminum material to form the $AlF_3$ layer 410 on the chamber 110 as shown by process S210 in FIG. 10.

The $AlF_3$ layer 410 may protect aluminum material in the chamber 110. In particular, the $AlF_3$ layer 410 may reduce and/or prevent the aluminum material from being etched during a cleaning process of the chamber 110.

In addition, the $AlF_3$ layer 410 may be formed not only on the surface of the aluminum material but also inside the chamber 110. That is, the $AlF_3$ layer 410 may also be formed on the inner wall of the chamber 110, on the surface of the stage 120, and on the surface of the showerhead 150, for example.

After the $AlF_3$ layer 410 is formed inside the chamber 110, a supply of the $NF_3$ gas or the $F_2$ gas may be suspended. An $NF_3$ gas serving as the cleaning gas may be supplied from the gas supply unit 160 to the chamber 110, and non-reacted gases and by-products generated by forming the $AlF_3$ layer 410 may be exhausted through the exhaust line 114 by an operation of the exhaust unit 116.

Figure 12:
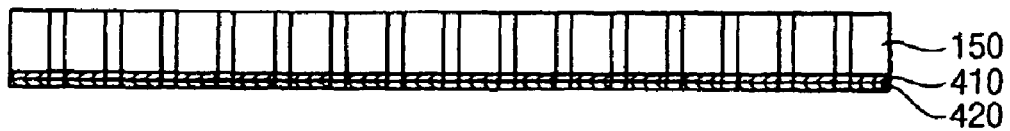
Figure 12:
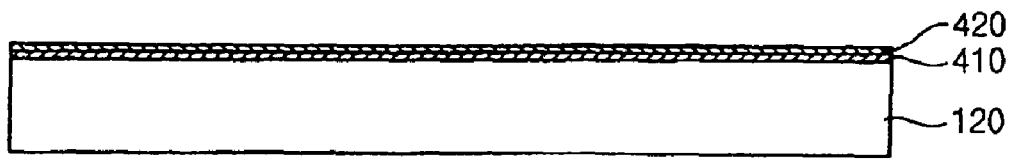
Figure 13:
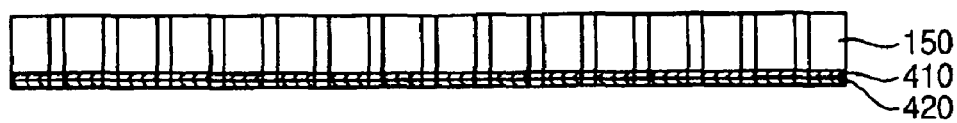
Figure 13:
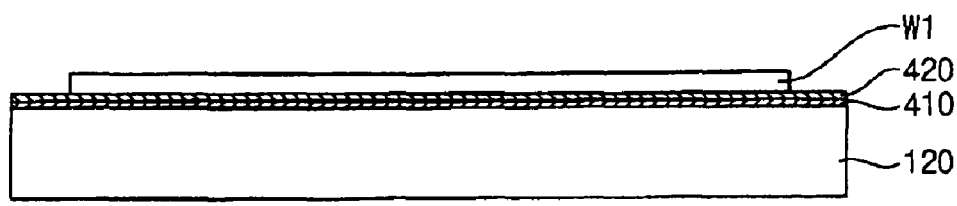
Figure 14:
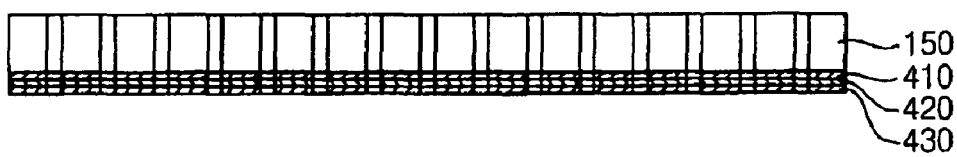
Figure 14:
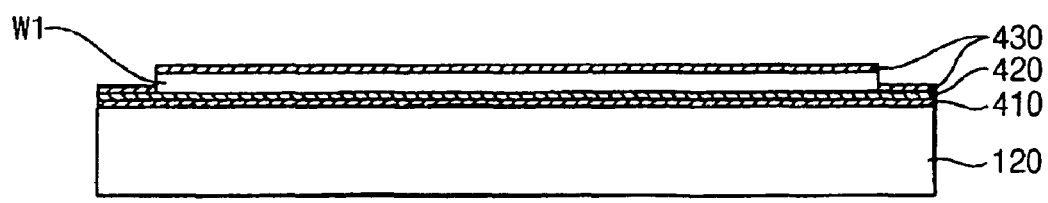
Figure 15:
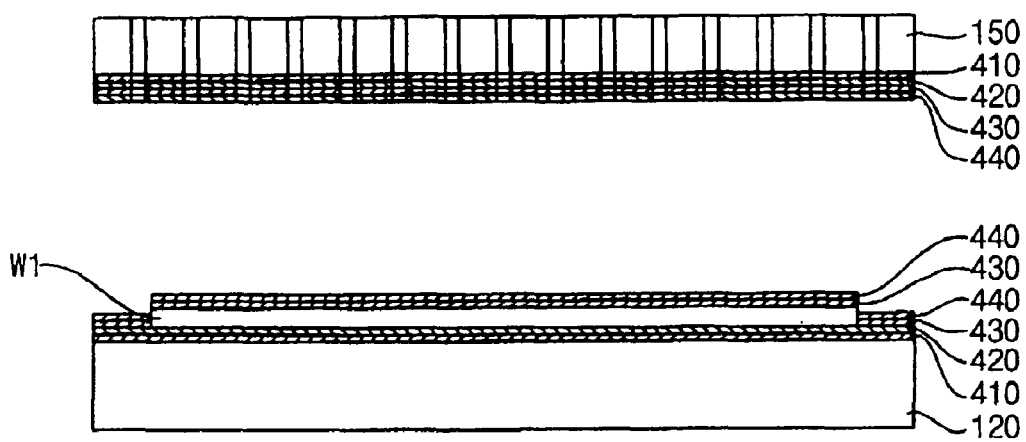
Figure 16:
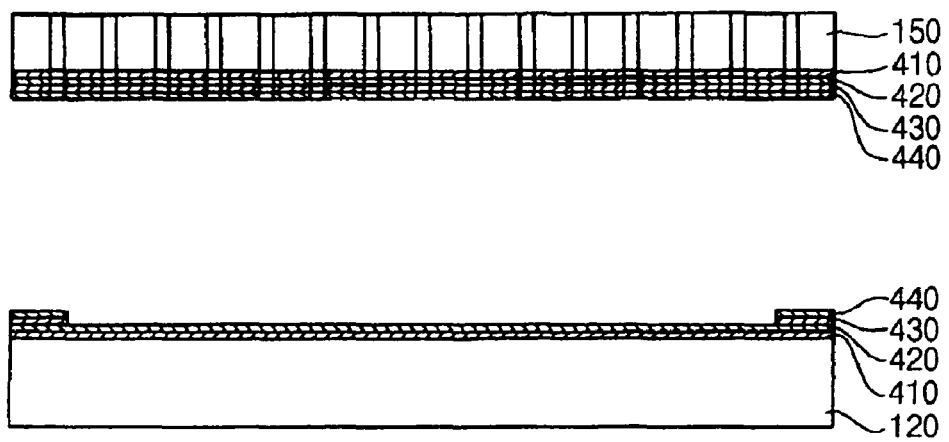
Figure 17:
Figure 17:
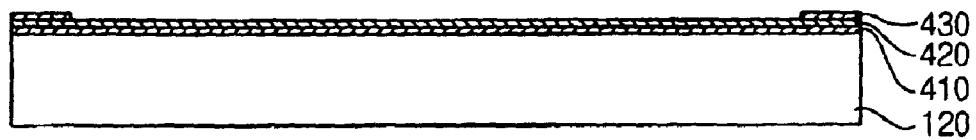
Figure 18:
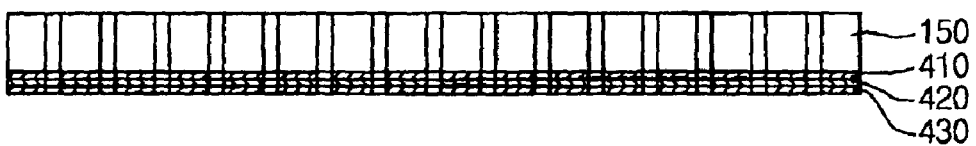
Figure 18:
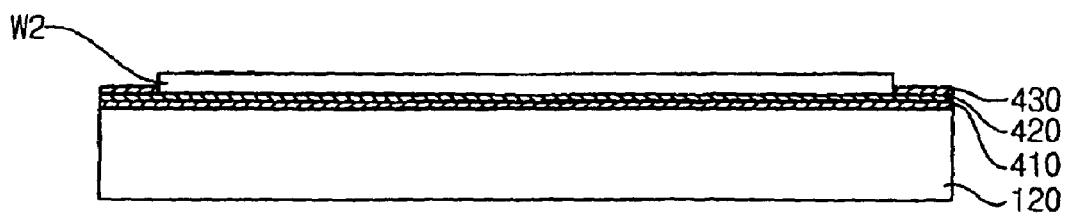

Referring to FIGS. 10 to 12, the stage 120 may be heated to a temperature within a range of about 500° C. to about 700° C. by the stage heater 130 for forming a first titanium layer 420. The showerhead 150 may be heated to a temperature within a range of about 400° C. to about 700° C. by the showerhead heater 170 for forming a titanium layer 420 having high adhesion strength. A processing gas for forming the titanium layer 310, for example, $H_2$ gas, $TiCl_4$ gas, and Ar gas, may be supplied from a gas supply unit 160 to the chamber 110 at a desired and/or predetermined flow rate through the showerhead 150. The first titanium layer 420 may be formed by a plasma enhanced chemical vapor deposition process. Therefore, an RF power may be supplied from the power source 210 to the showerhead 150 to generate a high frequency electric field in the chamber 110. Accordingly, the first titanium layer 420 may be formed inside the chamber 110 in process S220 of FIG. 10.

The first titanium layer 420 may have a substantially uniform thickness and may evenly radiate heat in the chamber 110.

After the first titanium layer 420 is formed inside the chamber 110, the power supply to the showerhead 150 and the supply of gases, for example, the $H_2$ gas, the $TiCl_4$ gas, and the Ar gas, to the chamber 110 may be suspended. A $NF_3$ gas serving as the cleaning gas may then be supplied from the gas supply unit 160 to the chamber 110, and non-reacted gases and by-products generated by forming the first titanium layer 420 may be exhausted through the exhaust line 114 by an operation of the exhaust unit 116.

Referring to FIGS. 10 and 13 to 18, a first wafer W1 may be loaded on the stage 120 on which the $AlF_3$ layer 410 and the first titanium layer 420 may have been formed in the process S230. In process S240, a second titanium layer 430 may be formed on the first wafer W1. In process S250, a titanium nitride layer 440 may be formed on the second titanium layer 430. In process S260, the first wafer W1 may be unloaded from the stage 120. In process S270, by-products, which may be adhered to the inside of the chamber 110 during formation of the titanium nitride layer 400, may be removed from the inside of the chamber 110. Then, the processes (process S230 to process S270) may be repeated on a second wafer W2 in process S280.

The repeated processes may be substantially the same as those described with reference to FIGS. 3 to 9. Thus, further explanation of the repeated processes will be omitted herein for the sake of brevity.

According to an example embodiment of the present invention, the above-described processes may be performed in-situ in one chamber 110. Moreover, the by-products, which may adhere to the inside of the chamber 110 during formation of the titanium nitride layer 440, may be removed to reduce and/or prevent particles from being generated.

Further, according to an example embodiment of the present invention, the temperatures of the stage 120 and the showerhead 150 may be kept relatively constant. Therefore, the efficiency of the process of forming a layer may be improved according to an example embodiment of the present invention because fewer resources may be used and/or needed to change the temperatures of the stage 120 and the showerhead 150.

Moreover, according to an example embodiment of the present invention, the $AlF_3$ layer 410 may be formed on the inside of the chamber 110 to reduce and/or prevent damage to the inside of the chamber, which may be caused the cleaning gas or the etching gas. The $AlF_3$ layer 410 may have high adhesion strength to inhibit and/or prevent the first titanium layer 420 from being lifted. The first titanium layer 420 may have a substantially uniform thickness and may evenly radiate a heat in the chamber 110 according to an example embodiment of the present invention.

Figure 19:
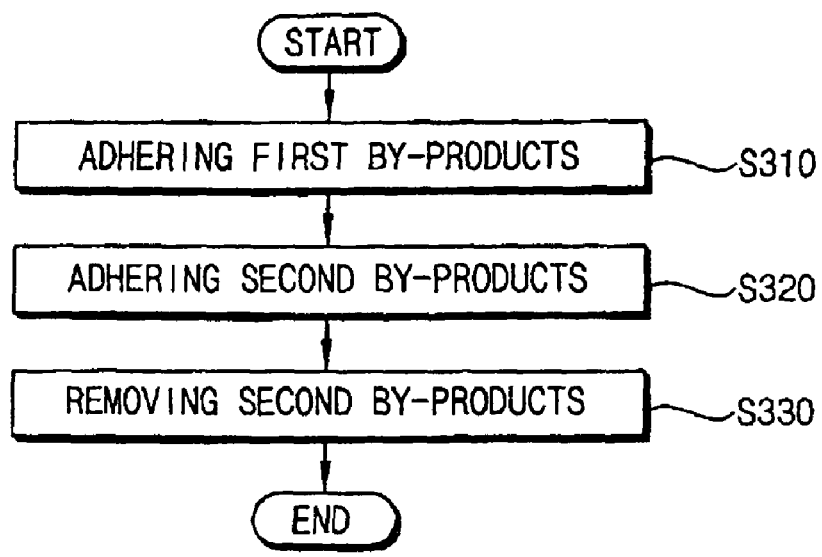
Figure 20:
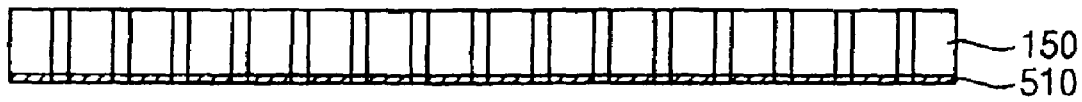
Figure 21:
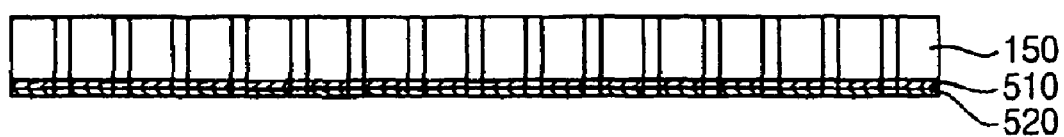
Figure 22:
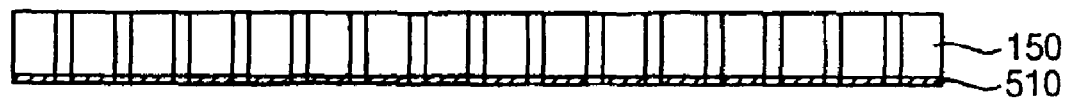

FIG. 19 is a flow chart illustrating a method of removing by-products according to an example embodiment of the present invention, and FIGS. 20 to 22 are cross-sectional views illustrating a stage and a showerhead that may be used in the method in FIG. 19. While first by-products and second by-products may be formed on an entire inner wall of a chamber, only the first by-products and the second by-products formed on a showerhead are illustrated in FIGS. 20 to 22.

Referring to FIGS. 19 and 20, the stage 120 may be heated to a temperature within a range of about 500° C. to about 700° C. by the stage heater 130 for forming a titanium layer. The showerhead 150 may be heated to a temperature within a range of about 400° C. to about 700° C. by the showerhead heater 170 for forming a titanium layer 310 having high adhesion strength on a surface of the showerhead 150. A processing gas for forming the titanium layer, which may include a $H_2$ gas, a $TiCl_4$ gas, and an Ar gas, for example, may be supplied from a gas supply unit 160 to the chamber 110 at a desired and/or predetermined flow rate through the showerhead 150. The titanium layer may be formed by a plasma enhanced chemical vapor deposition process. Therefore, an RF power may be supplied from the power source 210 to the showerhead 150 to generate a high frequency electric field in the chamber 110. Accordingly, the titanium layer having a first adhesion strength may be formed on a wafer W.

During the formation of the titanium layer on the wafer W, first by-products 510 may adhere to an inner wall of the chamber 110, a surface of the stage 120, and a surface of the showerhead 150 as shown by process S310 in FIG. 19. The first by-products 510 may include the titanium layer and have a first adhesion strength.

After the titanium layer is formed on the wafer W, a power supply to the showerhead 150 and a supply of gases, for example, $H_2$ gas, $TiCl_4$ gas and Ar gas, to the chamber 110 may be suspended. A $NF_3$ gas serving as the cleaning gas may be supplied from the gas supply unit 160 to the chamber 100, and non-reacted gases and by-products generated by forming the titanium layer may be exhausted through the exhaust line 114 by an operation of the exhaust unit 116.

Referring to FIGS. 19 and 21, after cleaning inside the chamber 110, the stage heater 130 may heat the stage 120 to a temperature substantially the same as the temperature used during formation of the titanium layer. That is, the temperature of the stage 120 may be maintained within a range of about 500° C. to about 700° C. Further, the showerhead heater 170 may heat the showerhead 150 to a temperature substantially the same as the temperature used during formation of the titanium layer. That is, the temperature of the showerhead 150 may be maintained within a range of about 400° C. to about 700° C. Next, a processing gas for forming a titanium nitride layer that may include a $NH_3$ gas, a $TiCl_4$ gas, and an Ar gas, for example, may be supplied from a gas supply unit 160 to the chamber 110 at a desired and/or predetermined flow rate through the showerhead 150. The titanium nitride layer may be formed by a thermal chemical vapor deposition process for example. Therefore, the power source 210 may be deactivated so that an RF power is not applied from the power source 210 to the showerhead 150. Accordingly, the titanium nitride layer having a second adhesion strength may be formed on the titanium layer. The second adhesion strength may be substantially weaker than the first adhesion strength.

During the formation of the titanium nitride layer, second by-products 520 may be formed on the surface of the wafer and on the first by-products 510 of the chamber 110 as shown by process S320 in FIG. 19. The second by-products 520 may include the titanium nitride layer and may have a second adhesion strength.

After the titanium nitride layer is formed on the titanium nitride layer, the supply of $NH_3$ gas, $TiCl_4$ gas and Ar gas to the chamber 110 may be suspended. An $NF_3$ gas serving as the cleaning gas may be supplied from the gas supply unit 160 to the chamber 100, and non-reacted gases and by-products generated by forming the titanium layer 310 may be exhausted through the exhaust line 114 by an operation of the exhaust unit 116.

Here, when the titanium layer and the titanium nitride layer are formed on a different wafer, the second by-products 520 may drop from the inner wall of the chamber 110 because the second adhesion strength of the second by-products 520 is weakened. The dropped second by-products 520 may serve as particles in forming the titanium layer and the titanium nitride layer on the different wafer. Therefore, the second by-products 520 may be removed according to an example embodiment of the present invention in order to reduce and/or prevent the lifting phenomenon from occurring.

Referring to FIGS. 19 and 22, the temperatures of the stage 120 and the showerhead 150 may be kept at a temperature substantially the same as the temperatures of the stage 120 and the showerhead 150 used during the process of forming the titanium layer and the titanium nitride layer, respectively. Next, a cleaning gas for removing the second by-products 520 may be supplied from a gas supply unit 160 to the chamber 110. Examples of the cleaning gas may include an $NF_3$ gas, an $Fl_2$ gas, a $Cl_2$ gas, etc. These may be used alone or in a mixture thereof.

According to an example embodiment of the present invention, a RF power may be supplied from the power source 210 to the showerhead 150 to convert the cleaning gas into a plasma state. Alternatively, the cleaning gas may be converted into the plasma state outside the chamber 110 by a remote plasma method and then, may be provided to the chamber 110.

Further, the cleaning gas may not be converted into the plasma state because the power source 210 may be deactivated. Here, the cleaning gas may be heated to a high temperature and the heated cleaning gas may be provided to the chamber 110.

The second by-products 520 in the chamber 110 may react with the cleaning gas to remove the first by-products 510 from the inside of the chamber 110 as shown by process S320.

In a process for removing the second by-products 520, there may be no need to change the temperatures of the stage 120 and the showerhead 150. Therefore, the process for removing the second by-products 520 may be substantially immediately performed after the process for forming the titanium layer and/or the titanium nitride layer. The second by-products 520 adhering to the inside of the chamber 110 may be removed to reduce and/or prevent unwanted particles from being generated. Therefore, the inner state of the chamber 110 may be maintained and the effects of a lifting phenomenon may be reduced and/or prevented.

According to an example embodiment of the present invention, the titanium nitride layer, which may adhere to the inside of the chamber during formation of the titanium layer and titanium nitride layer, may be removed from the inside of the chamber. Further, the dropping of the titanium nitride layer may be reduced and/or prevented. Therefore, an abnormal process of forming a layer, which may be caused by the titanium nitride layer serving as the particles, may be reduced and/or prevented.

Moreover, in a method of forming a layer according to an example embodiment of the present invention, the titanium/titanium nitride layer may be formed in-situ in one chamber. Therefore, fewer resources are used, thereby improving an efficiency of the process of forming a layer.

The foregoing is illustrative of the present invention and is not to be construed as limiting thereof. Although a few example embodiments of the present invention have been described, those skilled in the art will readily appreciate that many modifications are possible in example embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a layer, comprising:
loading a wafer into a chamber;
forming a first layer on the wafer by supplying a first gas into the chamber, wherein first by-products adhered to an inner wall of the chamber are generated by forming the first layer;
forming a second layer on the first layer by supplying a second gas into the chamber, wherein second by-products adhered to the first by-products are generated by forming the second layer;
unloading the wafer having the first layer and the second layer from the chamber; and
selectively removing the second by-products by supplying a third gas to the chamber;
wherein the first layer has a first adhesion strength,
wherein the second layer has a second adhesion strength, and
wherein the second adhesion strength is weaker than the first adhesion strength.

2. The method of claim 1, wherein loading the wafer, forming the first layer, forming the second layer, unloading the wafer, and selectively removing second by-products are repeatedly performed for a plurality of wafers.

3. The method of claim 1, wherein the first layer is a metal layer and the second layer is a metal nitride layer.

4. The method of claim 3, wherein the metal layer is a titanium layer and the metal nitride layer is a titanium nitride layer.

5. The method of claim 1, wherein forming the first layer, forming the second layer, unloading the wafer, and selectively removing the second by-products are performed at temperatures greater than or equal to about 400° C. less than or equal to about 700° C.

6. The method of claim 1, wherein the third gas includes at least one of a nitrogen trifluoride ($NF_3$) gas, a fluorine ($F_2$) gas, and a chlorine ($Cl_2$) gas.

7. The method of claim 1, further comprising:
converting the third gas into plasma;
wherein the second by-products are selectively removed by the plasma.

8. The method of claim 1, further comprising:
heating the third gas;
wherein the second by-products are selectively removed by the heated third gas.

9. The method of claim 1, further comprising:
forming a first protection layer, for protecting the chamber, on an inner wall of the chamber by supplying a first protective gas into the chamber; and
forming a second protection layer, for protecting the first protection layer, on the first protection layer by supplying a second protective gas into the chamber.

10. The method of claim 9, wherein the first protective gas includes a fluorine-containing gas.

11. The method of claim 9, wherein the second protection layer is a titanium layer.

12. The method of claim 9, wherein the first layer is a metal layer and the second layer is a metal nitride layer.

13. The method of claim 12, wherein the metal layer is a titanium layer and the metal nitride layer is a titanium nitride layer.

14. The method of claim 1, wherein the first layer is a metal layer.

15. The method of claim 1, wherein the second layer is a metal nitride layer.

16. A method of removing reaction by-products, comprising:
adhering first by-products to an inner wall of a chamber, wherein the first by-products are generated by forming a first layer on a wafer using a first gas;
adhering second by-products to the first by-products, wherein the second by-products are generated by forming a second layer on the first layer using a second gas; and
selectively removing the second by-products using a third gas;
wherein the first by-products have a first adhesion strength,
wherein the second by-products have a second adhesion strength, and
wherein the second adhesion strength is weaker than the first adhesion strength.

17. The method of claim 16, wherein the first by-products include a metal and the second by-products include a metal nitride.

18. The method of claim 17, wherein the metal is titanium and the metal nitride is titanium nitride.

19. The method of claim 16, wherein adhering the first by-products, adhering the second by-products, and selectively removing the second by-products are carried out at temperatures greater than or equal to about 400° C. and less than or equal to about 700° C.

20. The method of claim 16, wherein the third gas includes at least one of a nitrogen trifluoride ($NF_3$) gas, a fluorine ($F_2$) gas, and a chlorine ($Cl_2$) gas.

* * * * *